United States Patent
Matsumura et al.

(12)

(10) Patent No.: US 6,433,653 B1
(45) Date of Patent: Aug. 13, 2002

(54) MONOLITHIC LC RESONATOR AND FILTER WITH A CAPACITOR ELECTRODE WITHIN A TUBULAR INDUCTOR

(75) Inventors: Sadayuki Matsumura, Takefu; Noboru Kato, Sabae; Hiroko Nomura, Fukui-ken, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/659,216

(22) Filed: Sep. 11, 2000

(30) Foreign Application Priority Data

Sep. 10, 1999 (JP) .......................................... 11-257980

(51) Int. Cl.[7] ................................................ H03H 7/01
(52) U.S. Cl. ...................................... 333/185; 333/175
(58) Field of Search ................................. 333/175, 184, 333/185

(56) References Cited

U.S. PATENT DOCUMENTS 5,404,118 A   4/1995   Okamura et al. ........... 333/175
6,114,925 A * 9/2000   Lo ............................. 333/185

FOREIGN PATENT DOCUMENTS

EP   0 926 933 A1   6/1999

* cited by examiner

Primary Examiner—Justin P. Bettendorf
(74) Attorney, Agent, or Firm—Keating & Bennett, LLP

(57) ABSTRACT

A monolithic LC resonator includes insulation sheets and inductor patterns that are electrically connected through long via-holes formed in the insulation sheets. The long via-holes are arranged along the right edge and left edge of the inductor patterns, respectively. The inductor patterns and the long via-holes define an inductor having a tubular structure with a substantially rectangular cross-section and filled with an insulator therein. A capacitor pattern is opposed to the open ends of the inductor patterns through the sheets, respectively, to define a capacitor. That is, the capacitor pattern is laminated inside of the tubular structure of the inductor. The capacitor and the inductor having the tubular structure define an LC parallel resonance circuit.

20 Claims, 8 Drawing Sheets

MONOLITHIC LC RESONATOR AND FILTER WITH A CAPACITOR ELECTRODE WITHIN A TUBULAR INDUCTOR

BACKGROUND OF THE INVENTION

1. Field of the Invention

The present invention relates to a monolithic LC resonator and a monolithic LC filter, and more particularly, to a monolithic LC resonator and a monolithic LC filter for use in a high frequency wave band.

2. Description of the Related Art

FIGS. 13 and 14 show an example of a conventional monolithic LC resonator. As shown in FIG. 13, an LC resonator 100 includes a ceramic sheet 104 having a capacitor pattern 112 provided on the upper surface thereof, a ceramic sheet 105 having an inductor pattern 111 provided on the upper surface thereof, a ceramic sheet 106 having an input capacitor pattern 115 and an output capacitor pattern 116 provided on the upper surface thereof, ceramic sheets 102 and 108 having shield electrodes 113 and 114 provided on the upper surfaces thereof, respectively.

The ceramic sheets 101 to 108 are stacked, and fired to produce a laminate 110 shown in FIG. 14. On the laminate 110, an input terminal 121, an output terminal 122, and ground terminals 123 and 124 are provided. The input capacitor pattern 115 is connected to the input terminal 121. The output capacitor pattern 116 is connected to the output terminal 122. To the ground terminal 123, the lead-out portion of the inductor pattern 111, and one end of the shield electrodes 113 and 114 are connected. The lead-out portion of the capacitor pattern 112 to the ground terminal 124, and the other end of the shield electrodes 113 and 114 are connected.

In the above-described LC resonator 100, an inductor including the inductor pattern 111, and a capacitor including a capacitor pattern 112 opposed to the open end of the inductor pattern 111 define an LC parallel resonance circuit. The LC parallel resonance circuit is electrically connected to the input terminal 121 via a coupling capacitor including an inductor pattern 111 and the input capacitor pattern 115 opposed to each other. Similarly, the LC parallel resonance circuit is electrically connected to the output terminal 122 via a coupling capacitor including the inductor pattern 111 and the output capacitor pattern 116 opposed to each other.

The characteristics of the LC resonator depend on the Q value of the inductor in the resonance circuit. The Q value of the inductor is expressed as $Q=2\pi f_0 L/R$, in which L is the inductance of the inductor, R is the resistance of the inductor, and $f_0$ is the resonance frequency. As seen in this formula, the Q value of the inductor can be increased by decreasing the resistance R of the inductor. The inductance R is inversely proportional to the cross section of the inductor pattern 111. Hence, the Q value is increased by increasing the cross section S of the inductor pattern 111.

However, where the thickness of the inductor pattern 111 is increased to increase the cross section S of the inductor pattern 111, the internal strain of the laminate 110 is substantially increased when the ceramic sheets 101 to 108 are integrally fired, resulting in delamination and other problems.

Further, a magnetic field generated in the periphery of the inductor pattern 111 is concentrated on the edge of the inductor pattern 111, causing a large eddy current loss. Moreover, in the conventional LC resonator 100, the magnetic field generated in the periphery of the inductor pattern 111 is interrupted by the capacitor pattern 112. Thus, the inductance L of the inductor is very low.

As described above, with the conventional LC resonator 100, it is difficult to attain a high Q value because the resistance R of the inductor pattern 111 constituting the LC resonance circuit is large, and moreover, the inductance L is low.

SUMMARY OF THE INVENTION

To overcome the above-described problems, preferred embodiments of the present invention provide a monolithic LC resonator and a monolithic LC filter each including an inductor having a high Q value.

According to a preferred embodiment of the present invention, a monolithic LC resonator includes a laminated body including an insulation layer, an inductor pattern, and a capacitor pattern laminated together, an LC resonance circuit in the laminated body that includes an inductor defined by the inductor pattern, and a capacitor defined such that the capacitor pattern is opposed to the inductor pattern with the insulation layer being sandwiched between the capacitor pattern and the inductor pattern. In the monolithic LC resonator, the inductor of the LC resonance circuit has a tubular structure defined by at least two inductor patterns electrically connected through via-holes provided in the insulation layer, and the capacitor pattern is located inside of the tubular structure of the inductor.

Further, according to another preferred embodiment of the present invention, a monolithic LC filter includes a laminated body including a plurality of insulation layers, a plurality of inductor patterns, and a plurality of capacitor patterns laminated together, a plurality of LC resonators in the laminated body which include the plurality of inductors defined by the inductor patterns, and the plurality of capacitors defined such that the capacitor patterns are opposed to the inductor patterns with the insulation layers being sandwiched between the capacitor patterns and the inductor patterns. In the monolithic LC filter, the inductor of each LC resonator has a tubular structure defined by at least two inductor patterns electrically connected through via-holes provided in the insulation layer, and at least one of the capacitor pattern and a coupling capacitor pattern for capacitance-coupling the LC resonators is located inside of the tubular structure of the inductor.

The surface area of the inductor having the plurality of the tubular structure can be increased without increasing the thickness of the inductor pattern. In general, high frequency current flows so as to be concentrated onto the surface of a conductor, due to the skin effect. Accordingly, the entire inductor, of which the surface area is increased; is effectively used as a path for high frequency current. Accordingly, the resistance of the inductor is greatly decreased as compared with that of a conventional inductor, and the Q value of the inductor is greatly increased.

Further, with high frequency current flowing through the inductor, a magnetic field is generated in the outer periphery of the tubular structure, not the inside of the tubular structure. Thus, the capacitor pattern and the coupling capacitor pattern for capacitance-coupling the resonators, arranged inside of the inductor having the tubular structure, do not substantially interrupt the magnetic field of the inductor.

Further, since the inductor has the tubular structure, the concentration of a magnetic field, generated in the periphery of the inductor, onto the edges of the inductor pattern is substantially reduced.

Other features, elements, characteristics and advantages of preferred embodiments of the present invention will become apparent from the following detailed description of preferred embodiments thereof with reference to the attached drawings.

DETAILED DESCRIPTION OF PREFERRED EMBODIMENTS

Hereinafter, a monolithic LC resonator and a monolithic LC filter according to preferred embodiments of the present invention will be described with reference to the accompanying drawings.

Figure 1:
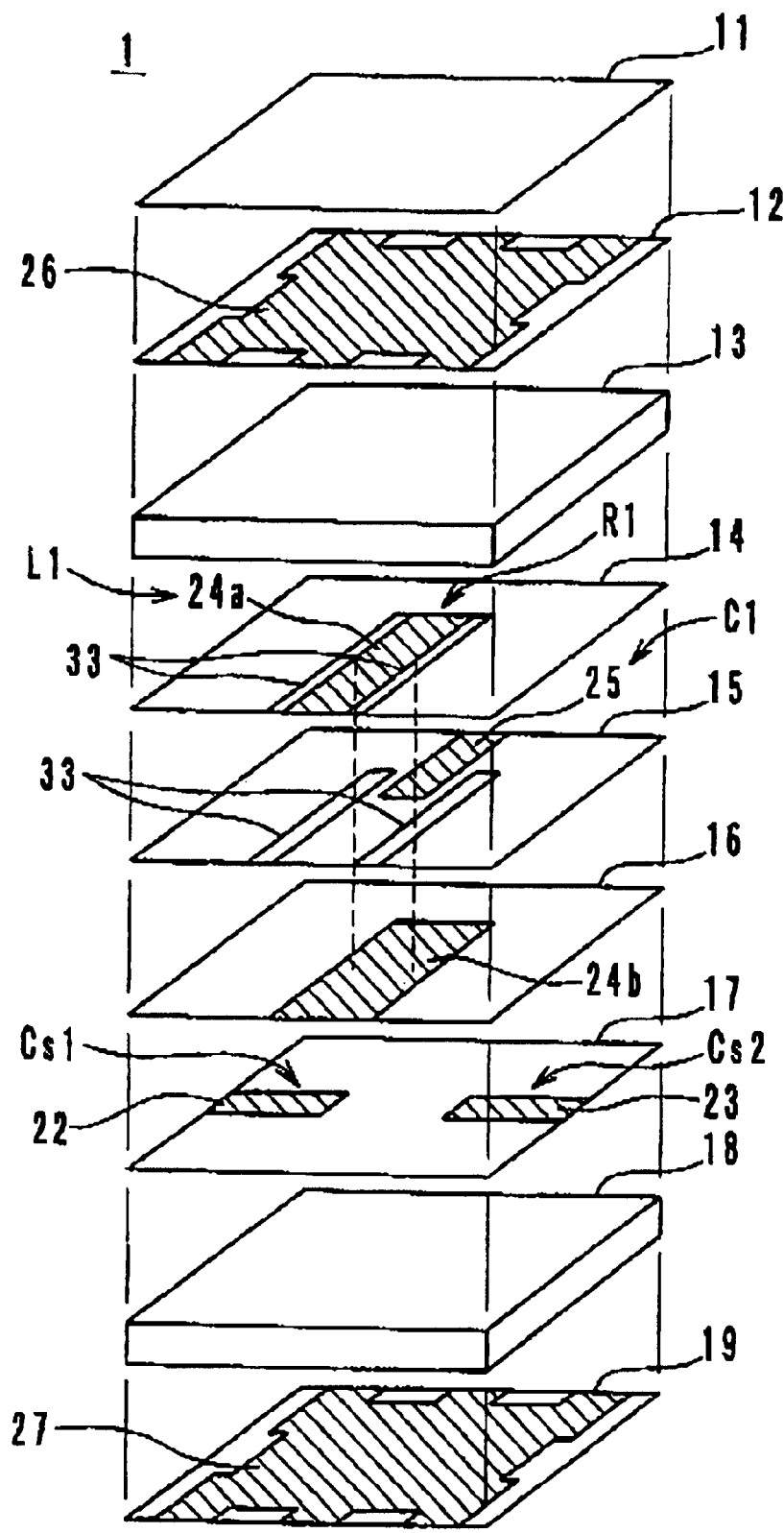
FIG. 1 is an exploded perspective view showing the configuration of a monolithic LC resonator according to a preferred embodiment of the present invention.
Figure 2:
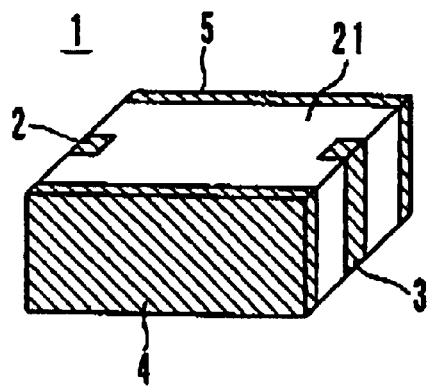
FIG. 2 is a perspective view showing the appearance of the monolithic LC resonator of FIG. 1.
Figure 4:
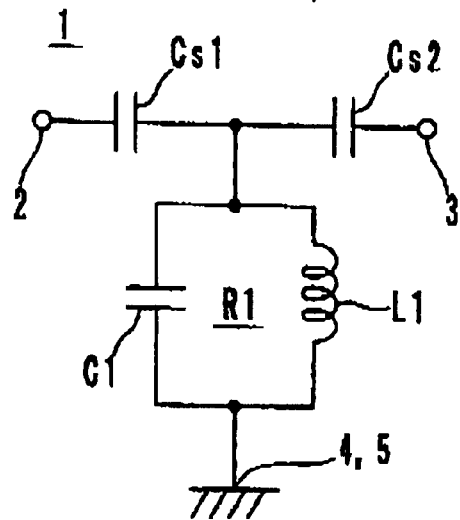
FIG. 4 is an electric equivalent circuit diagram of the monolithic LC resonator of FIG. 2.

FIG. 1 shows the configuration of a monolithic LC resonator 1. FIGS. 2 and 4 are a perspective appearance view of the LC resonator 1 and an electric equivalent circuit diagram thereof, respectively. The LC resonator 1 includes an LC parallel resonance circuit R1 including an inductor L1 and a capacitor C1. The LC parallel resonance circuit R1 is electrically connected between an input terminal 2 and an output terminal 3 via coupling capacitors Cs1 and Cs2, respectively.

As shown in FIG. 1, the resonator 1 includes insulation sheets 14 and 16 having inductor patterns 24a and 24b provided thereon, respectively, an insulation sheet 15 having a capacitor pattern 25 provided thereon, an insulation sheet 17 having an input lead-out pattern 22 and an output lead-out pattern 23 provided thereon, and insulation sheets 12 and 19 having shield patterns 26 and 27 provided thereon, respectively. The insulation sheets 11 to 19 are preferably produced by kneading dielectric powder or magnetic powder together with a binder or other suitable material, and forming this mixture into sheets. The patterns 22 to 27 are made of Ag, Pd, Cu, Ni, Au, Ag-13 Pd, or other suitable material, and are made by printing or other suitable method.

The linear inductor patterns 24a and 24b having a constant width are provided in the approximate central portion of the sheets 14 and 16. One end of the linear inductor patterns 24a and 24b are exposed on the front-sides as viewed in FIG. 1 of the sheets 14 and 16, respectively. The inductor patterns 24a and 24b are electrically connected to each other through long via-holes 33 provided in the sheets 14 and 15. The long via-holes 33 are disposed along the right edge and the left edge, as viewed in FIG. 1, of the inductor patterns 24a and 24b. The inductor patterns 24a and 24b, and the long via-holes 33 define an inductor L1 having a tubular structure with a substantially rectangular cross section and filled with an insulator therein, as shown in the cross-sectional view of FIG. 3.

As viewed in FIG. 1, the capacitor pattern 25 is provided in the center and rear of the sheet 15, and between the long via-holes 33 thereof. One end of the pattern 25 is exposed on the rear side of the sheet 15. The capacitor pattern 25 is opposed to the open ends of the inductor patterns 24a and 24b via the sheets 14 and 15, respectively, to define a capacitor C1. That is, the capacitor pattern 25 is located inside of the tubular structure of the inductor L1. The capacitor C1 and the tubular structure inductor L1 define the LC parallel resonance circuit R1.

The input and output capacitor patterns 22 and 23 are provided on the right side and the left side of the sheet 17. One end of the input capacitor pattern 22 is exposed on the left side of the sheet 17, and the other end of the input capacitor pattern 22 is opposed to the inductor pattern 24b with the sheet 16 being sandwiched between them to define the coupling capacitor Cs1. One end of the output capacitor pattern 23 is exposed on the right side of the sheet 17, and the other end of the output capacitor pattern 23 is opposed to the inductor pattern 24b with the sheet 16 being sandwiched between them to define the coupling capacitor Cs2. The shield patterns 26 and 27 having a wide area are arranged so as to sandwich the patterns 22, 23, 24a, 24b, and 25. The shield patterns 26 and 27 are exposed to the front and rear sides of the sheets 12 and 19, respectively.

The respective sheets 11 to 19 having the above-described configurations are sequentially stacked, joined under pressure, as shown in FIG. 1, and fired integrally to produce a laminated body 21 shown in FIG. 2. On the right-end and left end surfaces of the laminate 21, an input electrode 2 and an output electrode 3 are provided, respectively. Ground electrodes 4 and 5 are provided on the front surface and the back surface of the laminated body 21. The one end of the input capacitor pattern 22 is connected to the input electrode 2, and the one end of the output capacitor pattern 23 is connected to the output electrode 3. One end of the shield patterns 26 and 27 and one end of the inductor patterns 24a and 24b are connected to the ground electrode 4. The other end of the shield patterns 26 and 27, and one end of the capacitor pattern 25 are connected to the ground electrode 5.

Figure 3:
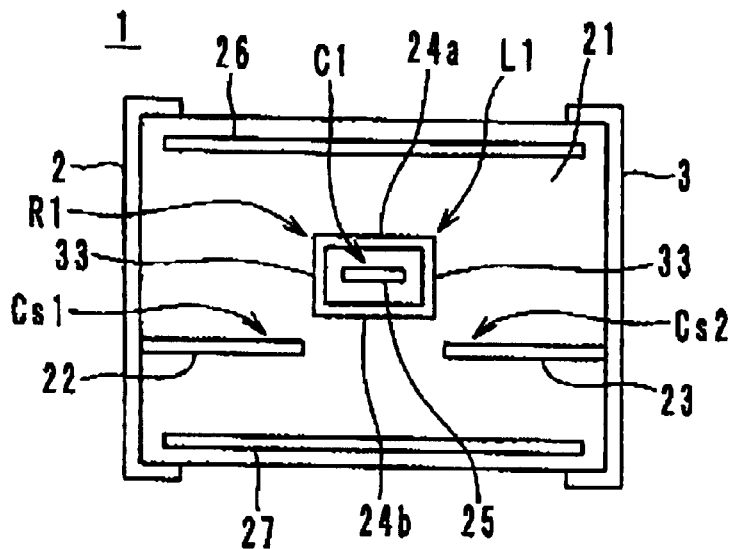
FIG. 3 is a schematic cross-sectional view of the monolithic LC resonator of FIG. 2.

In the monolithic resonator 1, the inductor L1 has the tubular structure defined by the inductor patterns 24a and 24b, and the long via-holes 33. The surface area of the inductor L1 is increased without increasing the thickness of the inductor patterns 24a and 24b and the long via-holes 33, as shown in FIG. 3. Generally, high frequency current has the properties that it flows so as to concentrate onto the surface of a conductor, due to the skin effect. Accordingly, the entire inductor L1 having the wider surface area is advantageously used as a path for the high frequency current. Thus, the resistance of the inductor L1 is significantly reduced as compared with of a conventional inductor, so that the Q value of the inductor L1 is greatly improved.

When high frequency current flows through the inductor L1, a magnetic field is generated in the outer periphery of the tubular structure, and is not generated inside of the tubular structure. Accordingly, the capacitor pattern 25 disposed inside of the inductor L1 having the tubular structure does not substantially interrupt the magnetic field of the inductor L1.

Further, the inductor L1 has the tubular structure, and thereby, the concentration of the magnetic field generated in the periphery of the inductor L1 on the edges of the inductor patterns 24a and 24b is substantially reduced. As a result, a monolithic LC resonator 1 having a high Q value and excellent characteristics is provided.

Figure 5:
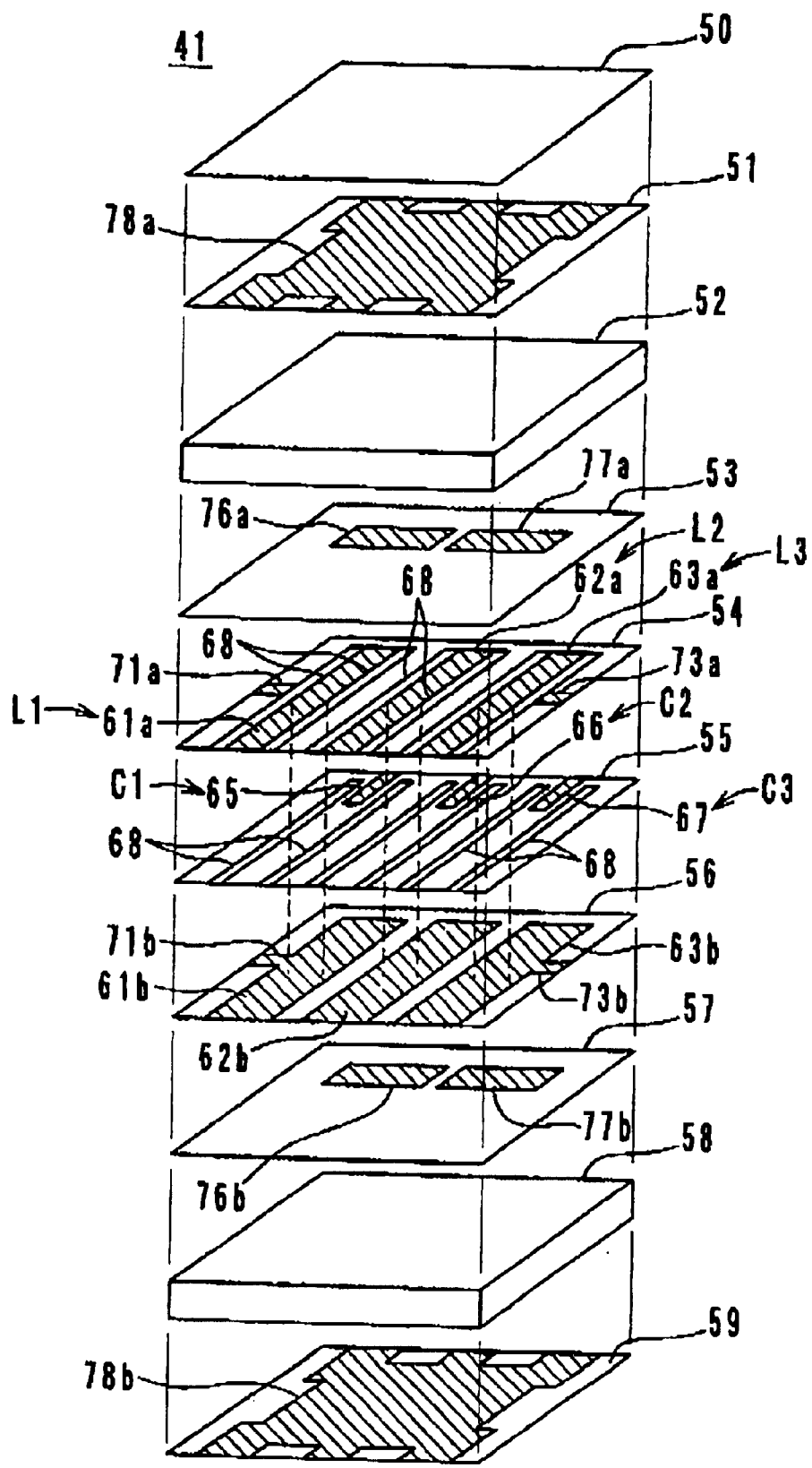
FIG. 5 is an exploded perspective view showing the configuration of a monolithic LC filter according to another preferred embodiment of the present invention.
Figure 6:
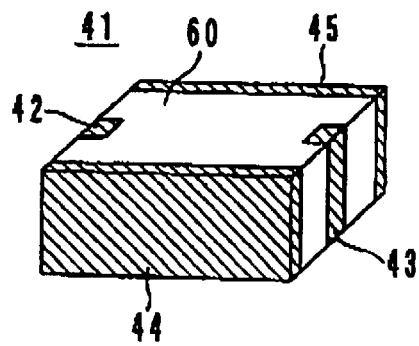
FIG. 6 is a perspective view showing the appearance of the monolithic LC filter of FIG. 5.
Figure 8:
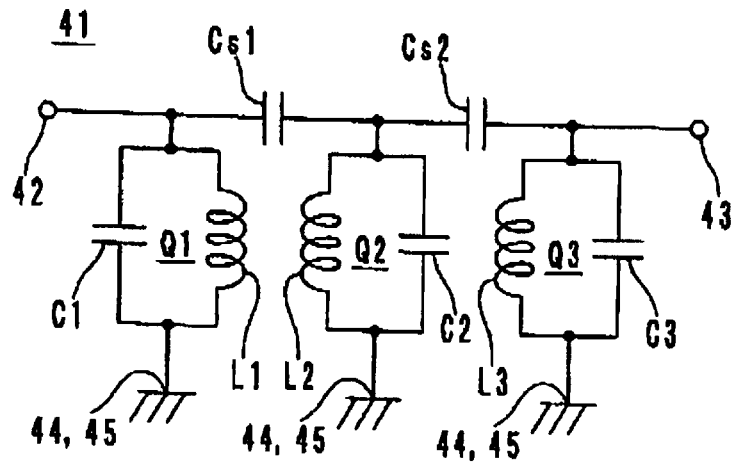
FIG. 8 is an electric equivalent circuit diagram of the monolithic LC filter of FIG. 6.

FIG. 5 shows the configuration of a monolithic LC filter 41 according to a second preferred embodiment of the present invention. FIGS. 6 and 8 are a perspective appearance view and an electric equivalent circuit diagram of the LC filter 41. In the third preferred embodiment, a band-pass filter as an example is described. Needless to say, the LC filter of preferred embodiments of the present invention may be a band-elimination filter or other suitable filter. The LC filter 41 is a three-stage LC band-pass filter. An LC resonator Q1 in the first (initial) stage, an LC resonator Q2 in the second stage, and an LC resonator Q3 in the third (final) stage are longitudinally connected via coupling capacitors Cs1 and Cs2, respectively.

As shown in FIG. 5, the LC filter 41 includes insulation sheets 54 and 56 having inductor patterns 61a, 62a, 63a, 61b, 62b, and 63b provided thereon, respectively, an insulation sheet 55 having capacitor patterns 65, 66, 67 and long via-holes 68 provided thereon, respectively, insulation sheets 53 and 57 having coupling capacitor patterns 76a, 77a, 76b, and 76b provided thereon, and insulation sheets 51 and 59 having shield patterns 78a and 78b provided thereon, respectively.

The linear inductor patterns 61a and 61b are provided on the left side of the sheets 54 and 56, respectively. One end of the linear inductor patterns 61a and 61b is exposed on the front sides of the sheets 54 and 56, respectively. The inductor patterns 61a and 61b are electrically connected to each other through long via-holes 68 provided in the sheets 54 and 55. The long via-holes 68 are connected to the right edge and left edge of the inductor pattern 61a and 61b, respectively. The inductor patterns 61a and 61b, and the long via-holes 68 define an inductor L1 having a tubular structure with a substantially rectangular cross-section and filled with an insulator therein as shown in the cross-sectional view of FIG. 7. The input lead-out patterns 71a and 71b extend from the approximate centers of the inductor patterns 61a and 61b and are exposed onto the left side of the sheets 54 and 56, respectively.

The linear inductor patterns 62a and 62b are provided in the approximate center of the sheets 54 and 56. One end of the linear inductor patterns 62a and 62b is exposed on the front side of the sheets 54 and 56, respectively. The inductor patterns 62a and 62b are electrically connected to each other through long via-holes 68 provided in the sheets 54 and 55, respectively. The inductor patterns 62a and 62b, and the long via-holes 68 define an inductor L2 having a tubular structure with a substantially rectangular cross section, as shown in the cross-sectional view of FIG. 7.

Figure 7:
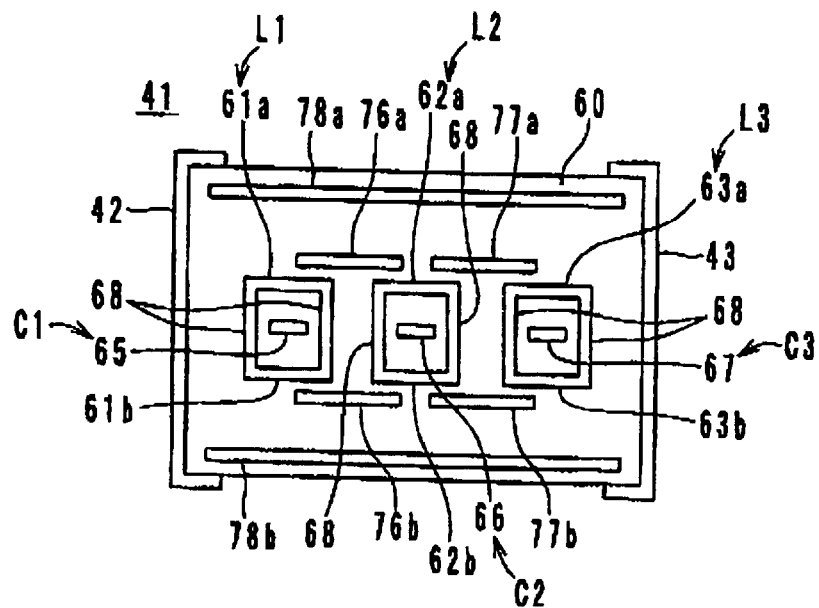
FIG. 7 is a schematic cross sectional view of the monolithic LC filter of FIG. 6.

The linear inductor patterns 63a and 63b are provided on the right side of the sheets 54 and 56, respectively. One end of the linear inductor patterns 63a and 63b is exposed on the front side of the sheets 54 and 56, respectively. The inductor patterns 63a and 63b are electrically connected to each other through long via-holes 68 provided in the sheets 54 and 55. The inductor patterns 63a and 63b, and the long via-holes 68 define an inductor L3 having a tubular structure with a substantially rectangular cross-section, as shown in FIG. 7. The output lead-out patterns 73a and 73b extend from the centers of the inductor patterns 63a and 63b and are exposed on the right side of the sheets 54 and 56.

The capacitor patterns 65, 66, and 67 are provided in the right rear, the center rear, and the left rear portions of the sheet 55, respectively. Further, each of the capacitor patterns 65, 66, and 67 is located between long via-holes 68. One end of the capacitor patterns 65, 66, and 67 is exposed on the rear side of the sheet 55. The capacitor pattern 65 is opposed to the open end of the respective inductor patterns 61a and 61b via the sheets 54 and 55, to define a capacitor C1. Similarly, the capacitor patterns 66 and 67 are opposed to the open end of the inductor patterns 62a and 62b and those of the inductor patterns 63a and 63b via sheets 54 and 55 to define capacitors C2 and C3, respectively. That is, the capacitor patterns 65, 66, and 67 are disposed inside of the tubular structures of the inductors L1, L2, and L3, respectively. The capacitor C1 and the tubular structure inductor L1 define an LC parallel resonance circuit, and thus define a first stage LC resonator Q1. The capacitor C2 and the tubular structure inductor L2 define an LC parallel resonance circuit, and thus define a second stage LC resonator Q2. The capacitor C3 and the tubular structure inductor L3 define an LC parallel resonance circuit, and thus define a third stage LC resonator Q3.

The coupling capacitors 76a, 76b, 77a, and 77b are located in the rear of the sheets 53 and 57, respectively. The coupling capacitor patterns 76a and 76b are opposed to the inductor patterns 61a, 62a, 61b, and 62b to define a coupling capacitor Cs1. The coupling capacitor pattern 77a and 77b are opposed to the inductor patterns 62a, 63a, 62b, and 63b to define a coupling capacitor Cs2.

The respective sheets 50 to 59 having the above-described configurations are sequentially stacked, as shown in FIG. 5, joined under pressure, and fired integrally to produce a laminated body 60 shown in FIG. 6. On the right-end and left end surfaces of the laminated body 60, an input electrode 42 and an output electrode 43 are provided, respectively. Ground electrodes 44 and 45 are provided on the front side and back side surfaces of the laminate 60. The input lead-out patterns 71a and 71b are connected to the input electrode 42. The output lead-out patterns 73a and 73b are connected to the output electrode 43. One end of the shield patterns 78a and 78b, and one end of the inductor patterns 61a to 63b are connected, respectively, to the ground electrode 44. The other end of the shield patterns 78a and 78b, and one end of the capacitor pattern 65 to 67 are connected, respectively, to the ground electrode 45.

In the monolithic LC filter 41, the inductors L1 to L3 of the respective LC resonators Q1 to Q3 have a tubular structure. With this configuration, the skin effect for high frequency currents is effectively utilized, and moreover, the capacitor patterns 65 to 67 do not substantially interrupt magnetic fields generated by the inductors L1 to L3. Hence, the inductors L1 to L3 achieve a very high Q value, respectively, and thereby, the LC filter 41 has excellent band-pass filter characteristics.

Figure 9:
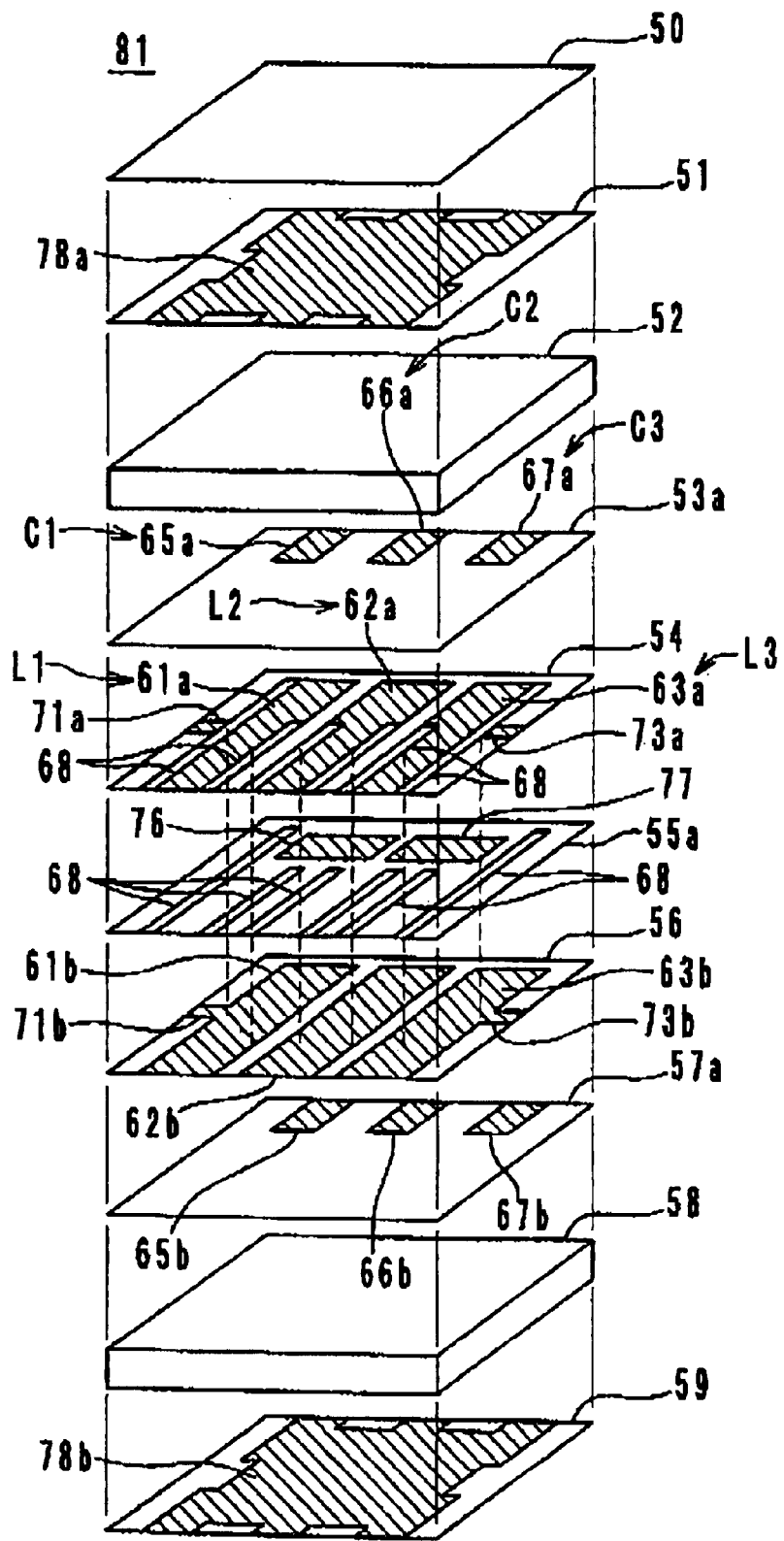
FIG. 9 is an exploded perspective view showing the configuration of a monolithic LC filter according to another preferred embodiment of the present invention.

As shown in FIG. 9, a monolithic LC resonator 81 according to the third preferred embodiment is the same as the LC resonator 1 of the second preferred embodiment except that three insulation sheets 53a, 55a, and 57a are used instead of the insulation sheets 53, 55, and 57. On the upper surfaces of the insulation sheets 53a and 57a, capacitor patterns 65a to 67a, and 65b to 67b are provided, respectively. On the upper surface of the insulation sheet 55a, coupling capacitor patterns 76 and 77 are provided. Of the six long via-holes 68 provided in each of the sheets 54 and 55a, the inner four long via-holes 68 are shorter than the two outer long via-holes 68 to avoid short-circuiting with the coupling capacitor patterns 76 and 77. In this preferred embodiment, elements corresponding to those of FIGS. 5 to 8 are designated by the same reference numerals, and the duplicate description is omitted.

Figure 10:
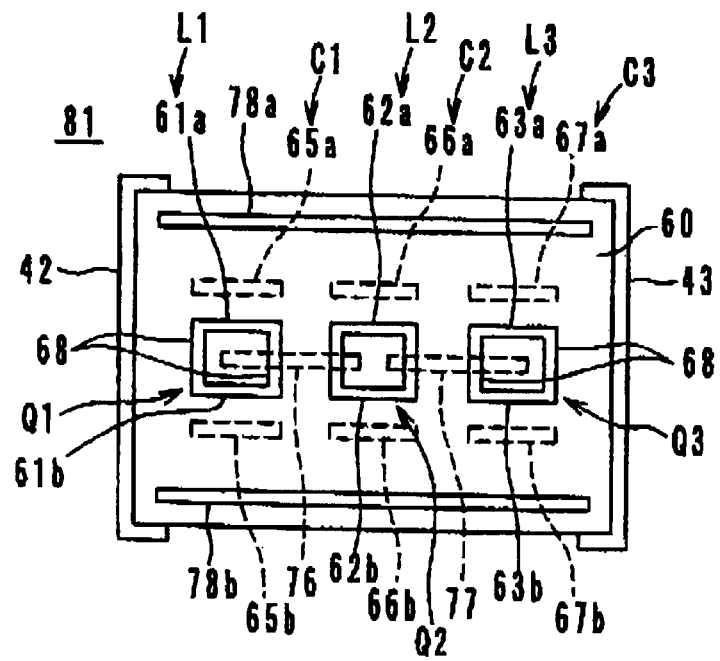
FIG. 10 is an electric equivalent circuit diagram of the monolithic LC filter of FIG. 8.

In the monolithic LC filter 81, the inductors L1 to L3 of the respective LC resonators Q1 to Q3 have a tubular structure. Accordingly, the skin effect for high frequency currents is effectively utilized. As seen in FIG. 10, both ends of each of the coupling capacitor patterns 76 and 77 are arranged within the tubular structure of the respective inductors L1 to L3. With this configuration, the coupling capacitor patterns 76 and 77 are do not cause interruption of magnetic fields of the inductors L1 to L3. Thus, the inductors L1 to L3 attain a high Q value. Accordingly, the LC filter 81 has excellent band-pass filter characteristics.

Figure 11:
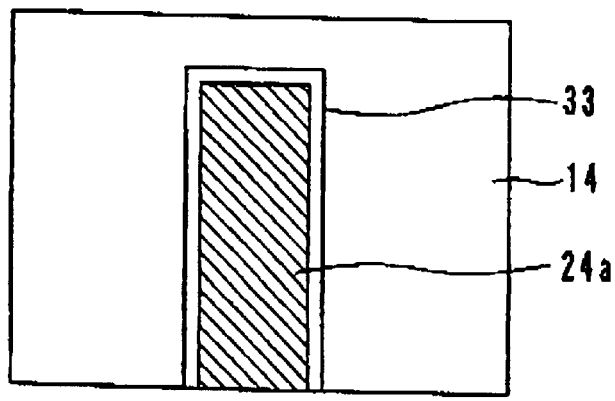
FIG. 11 is a plan view showing a modification example of the via-hole.
Figure 12:
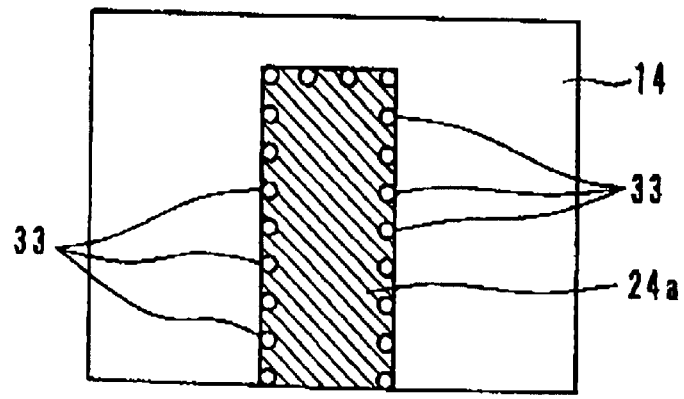
FIG. 12 is a plan view of a further modification example of the via-hole.
Figure 13:
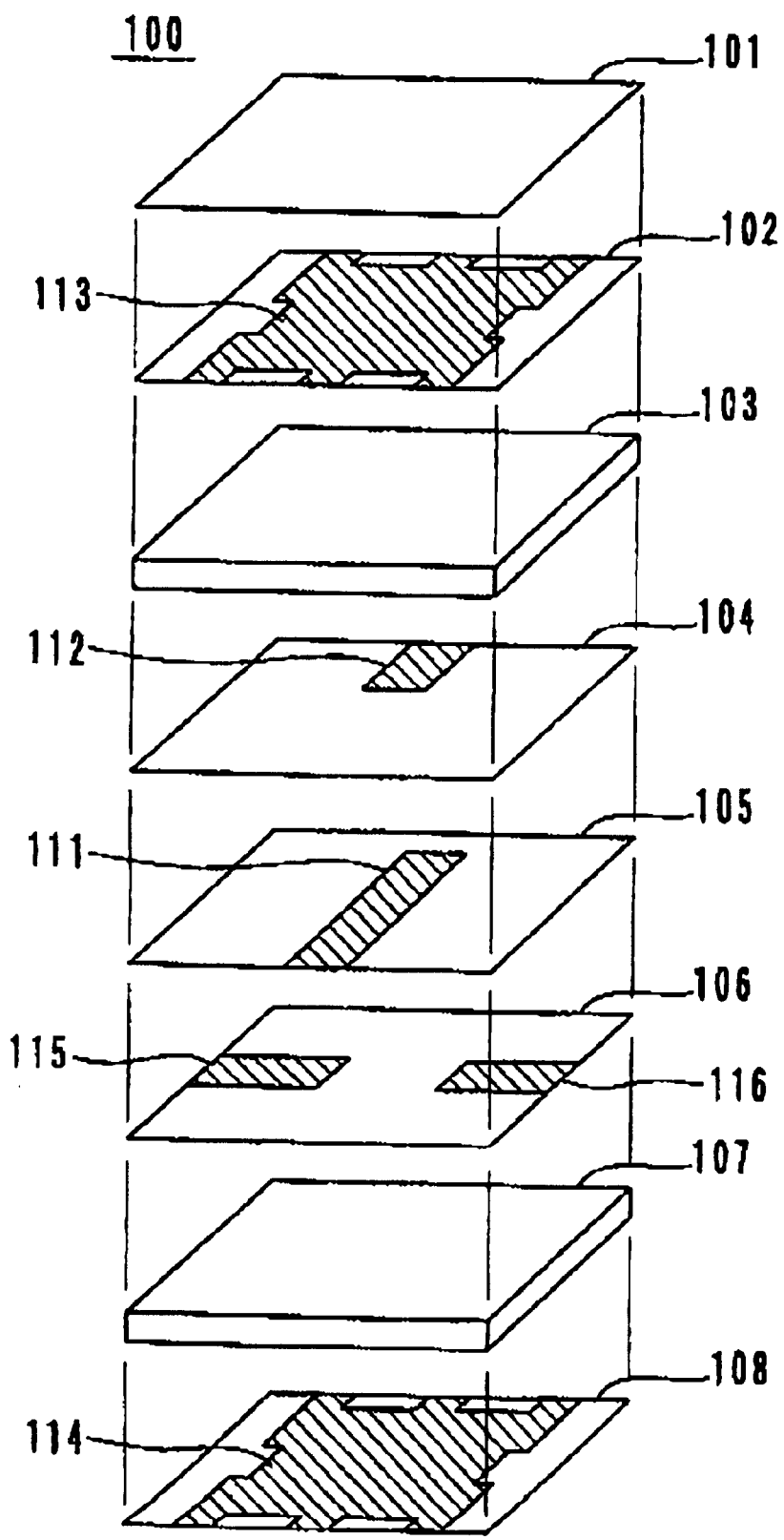
FIG. 13 is an exploded perspective view of a conventional monolithic LC resonator.
Figure 14:
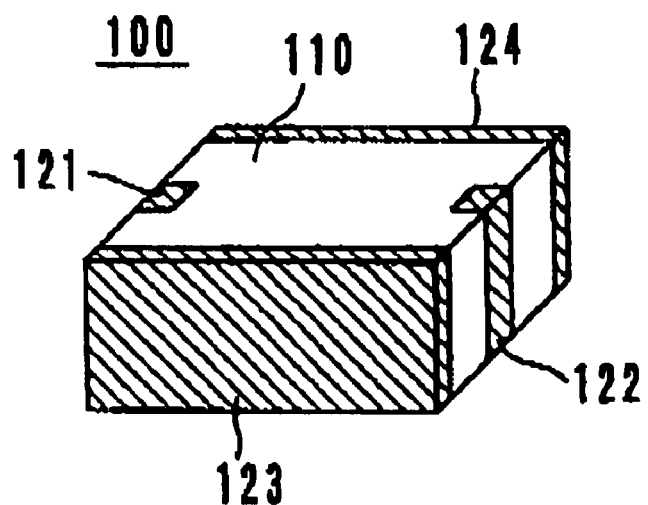
FIG. 14 is a perspective view showing the appearance of the monolithic LC resonator of FIG. 13.

The present invention is not restricted to the above-described preferred embodiments. Various changes and modifications can be made in the invention without departing from the sprit and scope thereof. For example, in the inductors according to the above preferred embodiments, each tubular structure having a substantially rectangular cross-section includes two inductor patterns and two long via-holes. The number and shape of inductor patterns, and those of via-holes are optional. For example, in the first preferred embodiment, as shown in FIG. 11, a long via-hole 33 may extend along the three sides of the inductor pattern 24a. Further, as shown in FIG. 12, a plurality of via-holes 33 may be arranged along the three sides of the inductor pattern 24a. Moreover, the number of LC filter stages (the number of resonators) is optional.

Further, in the above-described preferred embodiments, the insulation sheets having the patterns provided thereon are stacked, and fired so as to be integrated. The present invention is not restricted to these examples of preferred embodiments. As an insulation sheet, a sheet fired previously may be used. Further, the following production method may be used to define the LC resonator and the LC filter. After an insulation layer is produced from a paste insulation material by a printing method or other suitable method, a paste conductive pattern material is coated on the surface of an insulation layer to provide an optional pattern. Subsequently, the paste insulation material is coated so as to cover the pattern, whereby an insulation layer containing the pattern therein is produced. Similarly, the above-described coating is repeated thereon to define an LC resonator or an LC filter each having a laminated structure.

As seen in the above-description, according to various preferred embodiments of the present invention, the inductor defines the tubular structure. Accordingly, the surface area of the inductor is greatly increased without increasing the thickness of the inductor pattern. The whole of the inductor having the increased surface area can be effectively used as a path for high frequency current. Thus, the resistance of the inductor is greatly reduced as compared with that of a conventional inductor, and the Q value of the inductor is significantly increased. Further, with high frequency currents flowing through the inductor, magnetic fields are generated in the outer periphery of the tubular structure, not inside of the tubular structure. Accordingly, the capacitor pattern disposed inside of the inductor having the tubular structure and the coupling capacitor pattern for capacitance-coupling the resonators scarcely interrupt the magnetic field of the inductor.

Further, since the inductor includes the tubular structure, the concentration of a magnetic field, generated in the periphery of the inductor, onto the edges of the inductor pattern is substantially relaxed. As a result, a monolithic LC resonator and a monolithic LC filter each having very high Q value and excellent high-frequency characteristics is provided.

It should be understood that the foregoing description is only illustrative of preferred embodiments of the present invention. Various alternatives and modifications can be devised by those skilled in the art without departing from the present invention. Accordingly, the present invention is intended to embrace all such alternatives, modifications and variations that fall within the scope of the appended claims.

What is claimed is:

1. A monolithic LC resonator comprising:
   a laminated body including a plurality of insulation layers, an inductor pattern, and a capacitor pattern laminated together;
   an LC resonance circuit in the laminated body, which includes an inductor defined by the inductor pattern, and a capacitor defined such that the capacitor pattern is opposed to the inductor pattern with one of the plurality of insulation layers being sandwiched between the capacitor pattern and the inductor pattern;
   wherein said inductor of the LC resonance circuit has a tubular structure including at least two via-holes and at least two inductor patterns which are electrically connected to each other through said at least two via-holes, the at least two via-holes extending along a length of said inductor pattern, and the capacitor pattern is located inside of the tubular structure of said inductor.

2. A monolithic LC resonator according to claim 1, wherein said laminated body further includes another insulation layer having an input lead-out pattern and an output lead-out pattern provided thereon.

3. A monolithic LC resonator according to claim 2, wherein said input lead-out pattern includes one end which is exposed at one side of said laminated body and the other end being opposed to one of said inductor patterns, and said output lead-out pattern includes one end which is exposed at another side of said laminated body opposite to said one side and the other end being opposed to one of said inductor patterns.

4. A monolithic LC resonator according to claim 1, wherein said inductor patterns are linear inductor patterns having a constant width and provided in an approximate central portion of the insulation layer.

5. A monolithic LC resonator according to claim 1, wherein said inductor patterns are exposed at a front side of said insulation layer.

6. A monolithic LC resonator according to claim 5, wherein said capacitor pattern is exposed at a rear side of said insulation layer opposite to said front side of said insulation layer.

7. A monolithic LC resonator according to claim 1, wherein said via-holes are long openings extending along three sides of said inductor patterns.

8. A monolithic LC resonator according to claim 1, wherein said laminated body further includes additional insulation layers having shield patterns provided thereon.

9. A monolithic LC resonator according to claim 8, wherein said shield patterns have wide patterns to sandwich the inductor patterns and the capacitor pattern therebetween.

10. A monolithic LC resonator according to claim 1, wherein said via-holes includes a plurality of via-holes extending along three sides of said inductor patterns.

11. A monolithic LC filter comprising:
   a laminated body including a plurality of insulation layers, a plurality of inductor patterns, and a plurality of capacitor patterns laminated together;
   a plurality of LC resonators in the laminated body, each of which includes a plurality of inductors defined by the plurality of inductor patterns, and a plurality of capacitors defined such that the plurality of capacitor patterns are opposed to the plurality of inductor patterns with at least one of the plurality of insulation layers being sandwiched between the capacitor patterns and the inductor patterns;
   wherein the inductors of each LC resonator have tubular structures including at least two via-holes and at least two inductor patterns electrically connected through said via-holes, the at least two via-holes extending along a length of said inductor pattern, and at least one of the capacitor patterns and a coupling capacitor pattern for capacitance-coupling the LC resonators is located inside of the tubular structure of said inductor.

12. A monolithic LC filter according to claim 11, wherein said via-holes include long openings that extend along three sides of said at least two inductor patterns.

13. A monolithic LC filter according to claim 11, wherein said via-holes include a plurality of via-holes arranged along three sides of said at least two inductor patterns.

14. A monolithic LC resonator according to claim 11, wherein said laminated body further includes another insulation layer having an input lead-out pattern and an output lead-out pattern provided thereon.

15. A monolithic LC resonator according to claim 14, wherein said input lead-out pattern includes one end which is exposed at one side of said laminated body and the other end being opposed to one of said plurality of inductor patterns, and said output lead-out pattern includes one end which is exposed at another side of said laminated body opposite to said one side and the other end being opposed to one of said plurality of inductor patterns.

16. A monolithic LC filter according to claim 11, wherein said plurality of inductor patterns are linear inductor patterns having a constant width and provided in an approximate central portion of the insulation layers.

17. A monolithic LC resonator according to claim 11, wherein each of said plurality of inductor patterns is exposed at a front side of one of said insulation layers.

18. A monolithic LC resonator according to claim 17, wherein each of said plurality of capacitor pattern is exposed at a rear side of one of said insulation layers opposite to said front side of said insulation layer.

19. A monolithic LC filter according to claim 11, wherein said LC filter is a three-stage LC band-pass filter.

20. A monolithic LC resonator according to claim 11, further including shield patterns having wide patterns to sandwich the plurality of inductor patterns and the plurality of capacitor patterns therebetween.

* * * * *